(12) United States Patent
Chen et al.

(10) Patent No.: US 9,373,705 B1
(45) Date of Patent: Jun. 21, 2016

(54) MANUFACTURING METHOD OF A FIN-SHAPED FIELD EFFECT TRANSISTOR AND A DEVICE THEREOF

(71) Applicant: UNITED MICROELECTRONICS CORPORATION, Hsinchu (TW)

(72) Inventors: Chun-Yu Chen, Taichung (TW);
Chung-Ting Huang, Kaohsiung (TW);
Ming-Hua Chang, Tainan (TW);
Tien-Chen Chan, Tainan (TW);
Yen-Hsing Chen, Taipei (TW);
Hsin-Chang Wu, Hsinchu (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/826,218

(22) Filed: Aug. 14, 2015

(51) Int. Cl.
| | |
|---|---|
| *H01L 29/66* | (2006.01) |
| *H01L 21/265* | (2006.01) |
| *H01L 29/49* | (2006.01) |
| *H01L 29/78* | (2006.01) |
| *H01L 29/165* | (2006.01) |

(52) U.S. Cl.
CPC .... *H01L 29/66795* (2013.01); *H01L 21/26506* (2013.01); *H01L 21/26513* (2013.01); *H01L 29/165* (2013.01); *H01L 29/4916* (2013.01); *H01L 29/6653* (2013.01); *H01L 29/66545* (2013.01); *H01L 29/7848* (2013.01); *H01L 29/7851* (2013.01)

(58) Field of Classification Search
CPC ............. H01L 2029/7858; H01L 21/823431;
H01L 21/823821; H01L 21/845; H01L 27/0886; H01L 27/0924; H01L 27/10826; H01L 27/10879; H01L 27/1211; H01L 29/41791; H01L 29/66795; H01L 29/785; H01L 2924/13067; H01L 21/26506; H01L 29/165; H01L 21/26513; H01L 29/7851; H01L 29/4916; H01L 29/7848; H01L 29/66545; H01L 29/6653; H01L 29/66; H01L 21/265; H01L 29/78; H01L 29/49
See application file for complete search history.

(56) References Cited

U.S. PATENT DOCUMENTS

| | | | |
|---|---|---|---|
| 2011/0147810 A1 | 6/2011 | Hsu | |
| 2013/0011983 A1* | 1/2013 | Tsai | ................ H01L 21/823807 438/285 |

* cited by examiner

*Primary Examiner* — Selim Ahmed
(74) *Attorney, Agent, or Firm* — Ding Yu Tan (57) ABSTRACT

The present invention provides a manufacturing method of a fin-shaped field effect transistor (FinFET), comprises the following steps. Firstly, providing a substrate having a fin structure; forming a gate structure on the fin structure perpendicular to a extending direction of the fin structure; performing an amorphous implantation to form an amorphous layer on a exposed portion of the fin structure exposed by the gate structure and a light-doping implantation; forming a sacrificial spacer on sides of the gate structure covering a portion of the amorphous layer on the fin structure; forming a trench on the fin structure adjacent to the sacrificial spacer; growing an alloy in the trench; and then removing the sacrificial spacer. The invention also provides a FinFET device thereof.

11 Claims, 7 Drawing Sheets

MANUFACTURING METHOD OF A FIN-SHAPED FIELD EFFECT TRANSISTOR AND A DEVICE THEREOF

FIELD OF THE INVENTION

The present invention is related to a manufacturing method of a fin-shaped field effect transistor (FinFET) and a device thereof, especially related to a manufacturing method and a device thereof with improved height variation of source and drain.

BACKGROUND OF THE INVENTION

The semiconductor integrated circuit (IC) industry has experienced exponential growth. Technological advances in IC materials and designs have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-shaped field-effect transistor (FinFET), has been introduced to replace a planar transistor. Although existing FinFET devices and methods of fabricating FinFET devices have been generally adequate for their intended purposes, they have not been entirely satisfactory in all respects. For example, a variation of height and width of source/drain epitaxial structures raise challenges in a FinFET process development. It is desired to have improvements in this area.

SUMMARY OF THE INVENTION

In an aspect of the present invention, it provides a manufacturing method of a fin-shaped field effect transistor (FinFET), comprises the following steps. Firstly, providing a substrate having a fin structure; forming a gate structure on the fin structure perpendicular to a extending direction of the fin structure; performing an amorphous implantation to form an amorphous layer on a exposed portion of the fin structure exposed by the gate structure and a light-doping implantation; forming a sacrificial spacer on two opposite sides of the gate structure covering a portion of the amorphous layer on the fin structure; forming a trench on the fin structure adjacent to the sacrificial spacer; growing an alloy in the trench; and then removing the sacrificial spacer.

In one embodiment of the present invention, wherein the gate structure comprises a conductor layer, a dielectric protecting layer on the top of the conductor layer, and a pair of spacers on sides of the stake of the conductor layer and the dielectric protecting layer.

In one embodiment of the present invention, wherein the conductor layer is a polysilicon.

In one embodiment of the present invention, wherein the dielectric protecting layer is a multi-layer structure.

In one embodiment of the present invention, the method further comprises removing the conductor layer and the dielectric protecting layer; and forming a metal electrode in-between the pair of spacers.

In one embodiment of the present invention, wherein the lightly-doped source and drain (LDD) implantation is performed after the amorphous implantation.

In one embodiment of the present invention, wherein the lightly-doped source and drain (LDD) implantation is performed before the amorphous implantation.

In one embodiment of the present invention, wherein a precursor of the amorphous implantation is selected from the group consisting of indium (In), argon (Ar), antimony (Sb), and germanium (Ge).

In one embodiment of the present invention, wherein the step of forming the trench comprises removing an exposed portion of the amorphous layer exposed by the sacrificial spacers and the gate structure.

In one embodiment of the present invention, wherein the alloy comprises a high concentrated center region and a low concentrated cap region on the top of the high concentration region.

In one embodiment of the present invention, wherein the high concentrated center region is partially covered by the amorphous layer.

In another aspect of the present invention, it provides a fin-shaped field effect transistor (FINFET) device comprises: a substrate having a fin structure; a plurality trenches formed on the fin structure with an alloy grown in the trenches; a gate structure on the fin structure perpendicular to an extending direction of the fin structure in-between the plurality of trenches; and an amorphous layer on a surface of the fin structure exposed by the gate structure and disposed in-between the gate structure and the alloy.

In one embodiment of the present invention, wherein the alloy comprises a high concentrated center region and a low concentrated cap region on the top of the high concentrated center region.

In one embodiment of the present invention, wherein the high concentrated center region is partially covered by the amorphous layer.

In one embodiment of the present invention, wherein the low concentrated cap region is laterally adjacent to the amorphous region.

In one embodiment of the present invention, wherein the high concentrate center region has a germanium concentration in a range of 35%-60%.

In one embodiment of the present invention, wherein the low concentrated cap region has a germanium concentration in a range of 20%-30%.

In one embodiment of the present invention, wherein the gate structure comprises a polysilicon conductor layer, a dielectric protecting layer on the top of the polysilicon conductor layer, and a pair of spacers on sides of a stack of the polysilicon conductor layer and the dielectric protecting layer.

In one embodiment of the present invention, wherein the dielectric protecting layer is a multi-layer structure.

In one embodiment of the present invention, wherein the gate structure comprises a metal electrode and a pair of spacers.

Accordingly, the present invention provides a method of a FinFET and a device thereof with an amorphous layer by an amorphous implantation in order to improve height variation of epitaxial grown sources and drain. Due to the amorphous layer on the top edge of the trench T1, the high concentration region of the alloy 5 (active region of the source/drain) is not able to grow above the amorphous layer even with longer time of epitaxial growth. And thus, the height of the source/drain epitaxial structure at the edge of a wafer can have about same height of the source/drain epitaxial structure at the center of the wafer. Better product yield and better performance of a FinFET device is then achieved.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention provides a manufacturing method of a FinFET and a device thereof with an amorphous implantation in order to improve height variation of epitaxial grown sources and drains and is described more specifically with reference to the following embodiments. It is to be noted that the following descriptions of preferred embodiments of this invention are presented herein for purpose of illustration and description only but not intended to be exhaustive or to be limited to the precise form disclosed.

In the following illustration, the element arranged repeatedly is described in word "one", "a" or "an" for simpler explanation. However, one skilled in the art should understand the practical structure and arrangement of each element based on the following illustration and figures provided in the present application.

Figure 1:
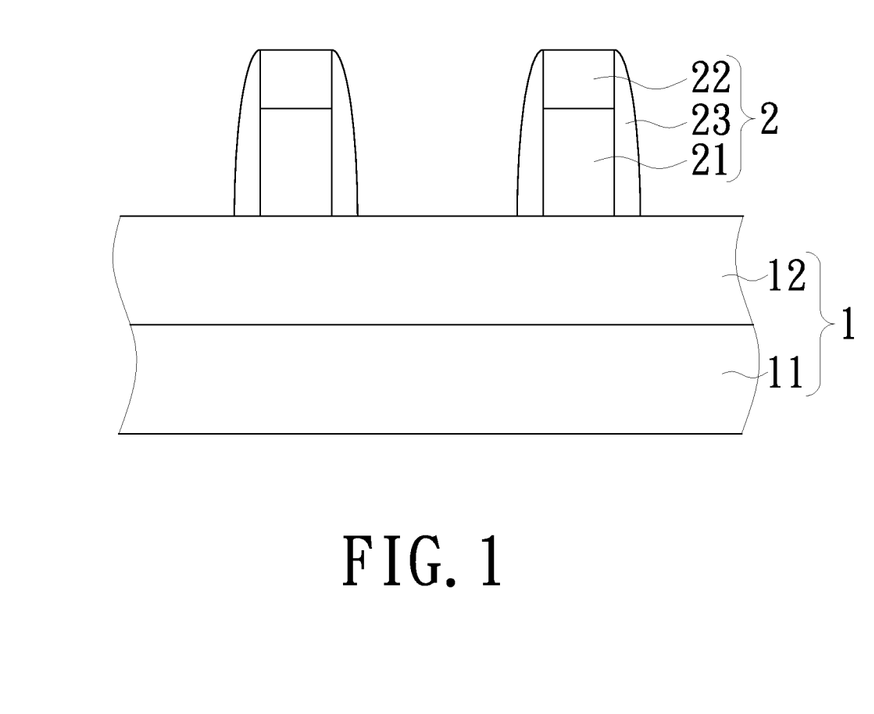
FIG. 1 is a cross-sectional view illustrating a manufacturing step of a substrate having a gate structure according to the method provided by the present invention.

FIGS. 1-7 are cross-sectional structures illustrating different steps during the manufacturing process following the method provided by the present invention. As shown in FIG. 1, a substrate 1 has a base 11 and a fin structure 12 on the base 11. The substrate 1 can be a polysilicon or silicon-containing substrate with polycrystalline lattice, and formation of the fin structure 12 can be similar or the same as conventional methods and are omitted from the illustration below for the sake of brevity. Then a gate structure 2 is formed on the fin structure 12 with a direction perpendicular to an extending direction of the fin structure 12. The gate structure 2 can comprises a conductor layer 21, a protecting layer 22, and a pair of spacers 23. The conductor layer 21 can be made of polysilicon or other conducting material. The protecting layer 22 is formed on the top of the conductor layer 21, to be used for protection. And the pair of spacers 23 is formed on two lateral/opposite sides of the stack of the conductor layer 21 and the protecting layer 22. The protecting layer 22 is made of dielectric material and can be multi-layer structure depending on different cases. For example, the protecting layer 22 may comprise a nitride layer (such as silicon nitride) right on the top of the conductor layer 21 and an oxide layer (for example, used as a hard mask) is then formed on the top of the nitride layer. The spacers 23 can also be a multi-layer structure formed by more than one layer of dielectric material.

Figure 2:
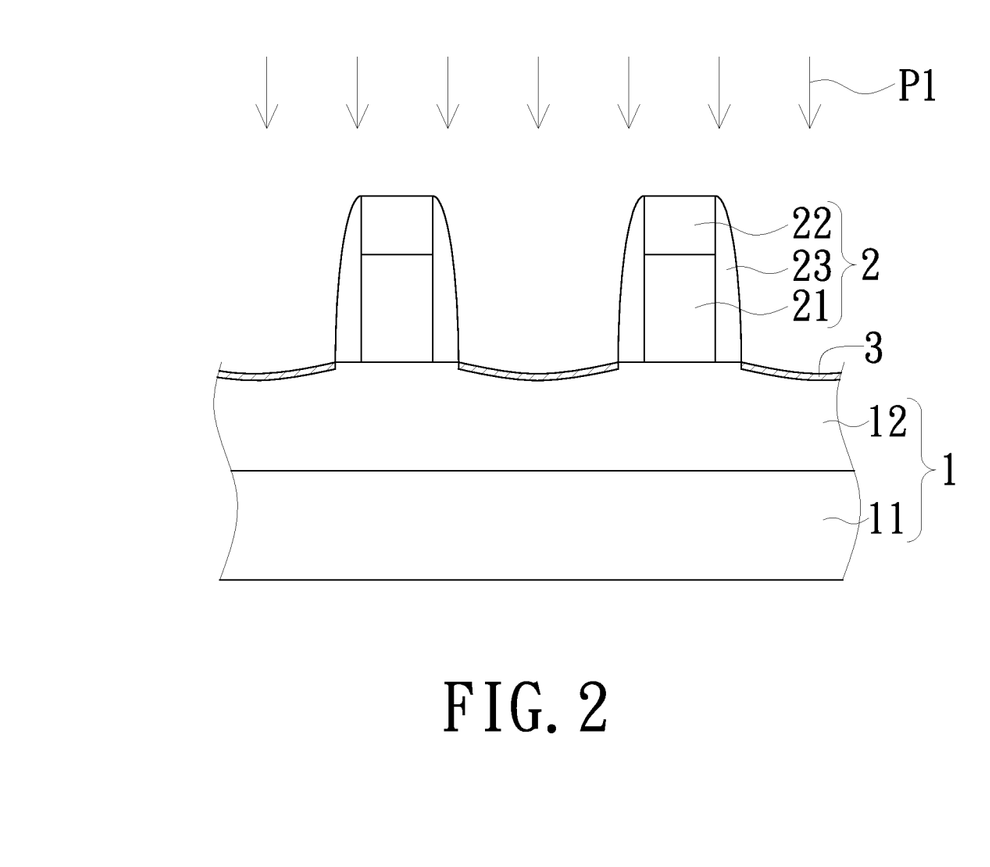
FIG. 2 is a cross-sectional view illustrating an amorphous layer formation step according to the method provided by the present invention.

Then as shown in FIG. 2, an amorphous implantation P1 is performed to form an amorphous layer 3 on an exposed portion of the fin structure 12 exposed by the gate structure 2. The precursor used in the amorphous implantation P1 is better to be heavy ions or atoms, and can be no electric charges to avoid affecting doping implantation later on in the manufacturing process. The precursor(s) can be selected from the group consisting of indium (In), argon (Ar), (Antimony) Sb, and germanium (Ge). However, as long as the amorphous layer 3 can be formed properly and the amorphous implantation P1 does not affect later process and product yield, precursor(s) can be selected from whatever it's suitable, such as boron (B) or difluoroboron ($BF_2$). Moreover, due to the impact of the precursor(s) to the surface of the exposed portion of the fin structure 12, the top surface of the amorphous layer 3 can be slightly curved down as shown in FIG. 2. In the case of polysilicon as the substrate 1, the amorphous layer 3 is amorphous silicon.

Figure 3:
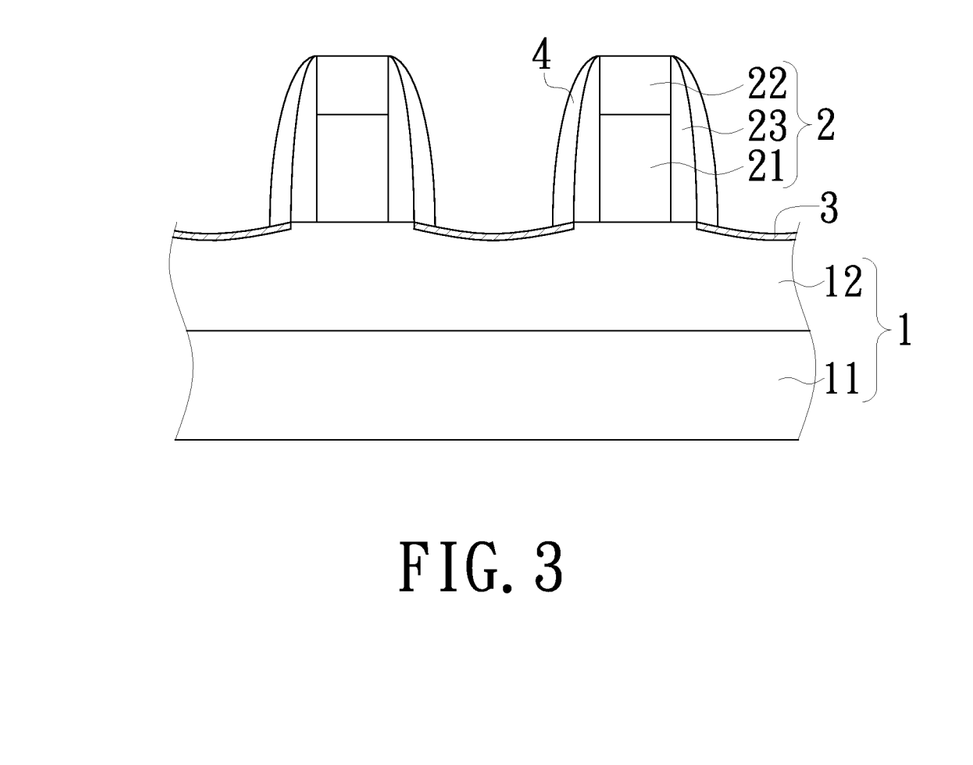
FIG. 3 is a cross-sectional view illustrating formation of a pair of sacrificial spacers according to the method provided by the present invention.

Then as shown in FIG. 3, a pair of sacrificial spacers 4 is formed on the lateral sides of the gate structure 2 covering the spacers 23 and a portion of the amorphous layer 3. A light doped source and drain (LDD) implantation (not shown) is selectively performed before the amorphous implantation P1 or before the formation of sacrificial spacers 4.

Figure 4:
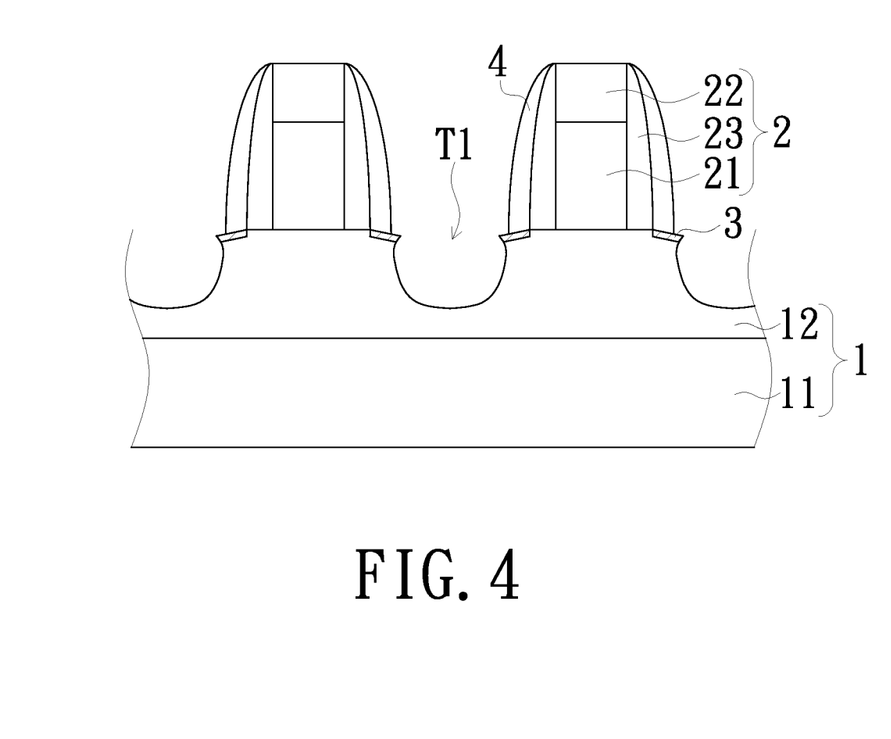
FIG. 4 is a cross-sectional view illustrating formation of a trench according to the method provided by the present invention.

A trench T1 is then formed on the fin structure adjacent to the sacrificial spacers 4 by etching and using the gate structure 2 and the sacrificial spacers 4 as a mask as shown in FIG. 4. Thus, the portion of the amorphous layer 3 covered by the sacrificial spacers 4 is remained on the fin structure 12 on the top edge of the trench T1. The shape of the trench T1 can be altered by different etching process, such as dry etch and wet etch, and also by different parameters of the process. However, the shape of the trench T1 is most-likely to be slightly narrower on the top and slightly larger in the middle of the trench T1 as shown in FIG. 4.

Figure 5:
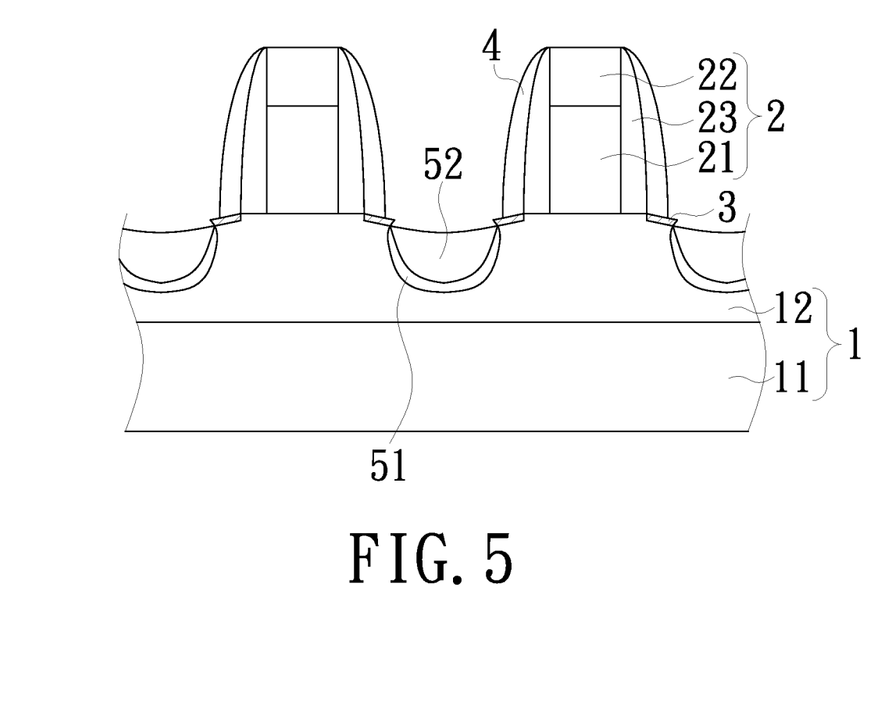
FIGS. 5-6 are cross-sectional views illustrating a process of selective epitaxial growth according to the method provided by the present invention.
Figure 6:
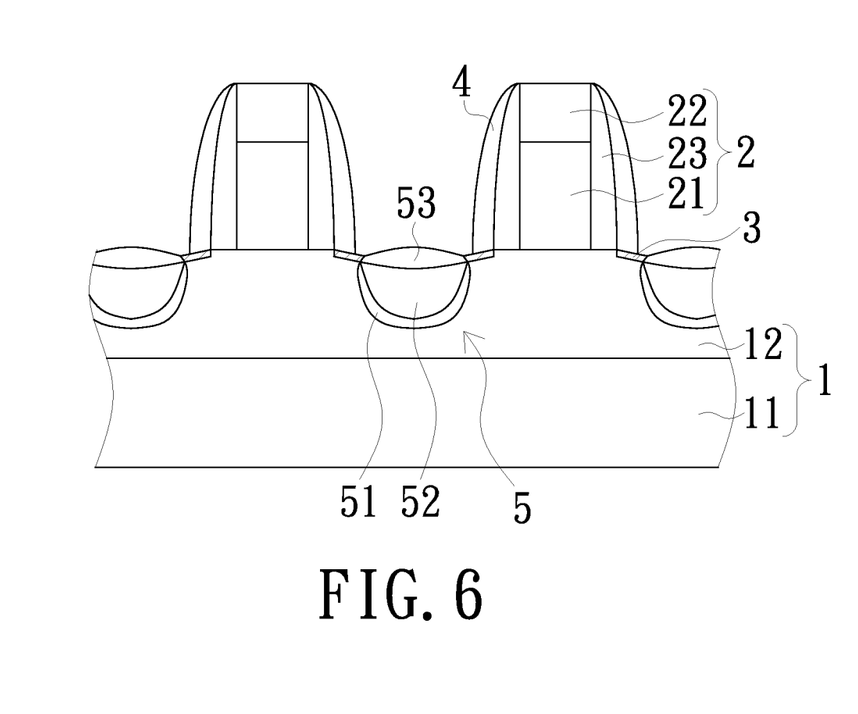

Then as shown in FIG. 5-6, a selectively epitaxial growth is performed to grow an alloy 5 in the trench T1. The alloy 5 can comprise three regions: a buffer region 51, a center region 52, and a cap region 53. As shown in FIG. 5, a buffer region 51 is firstly grown along the inner surface of the trench T1 having a relatively low concentration of metal component, and the center region 52 is then grown along the inner surface of the buffer region 51 having a relatively high concentration of metal component as shown in FIG. 5. The center region 52 has a metal concentration in a range of 35%-60% and preferably in a range of 40%-50%, and the buffer region 51 has a metal concentration in a range of 20%-30%. The buffer region 51 is used for preventing mismatch and interface effect between high concentration of metal component of an alloy 5 and the fin structure 12 of the substrate 1. For instance, in the case where the alloy 5 is silicon-germanium (SiGe) doped with boron, the buffer region 51 contains about 25% of germanium, and the center region 52 contains about 45% of germanium.

Following the method provided by the present invention, the center region 52 with higher concentration of germanium will stop growing at the bottom of the remained amorphous layer 3, as shown in FIG. 5. The buffer region 51 and the center region 52 are partially covered by the amorphous layer 3. Due to the crystal structure of the amorphous layer 3 and characteristics of selective epitaxial growth, a portion of an alloy with higher concentration of germanium is difficult to grow above the remained amorphous layer 3. Thus a height of the center region 52 of the alloy 5 with higher concentration of germanium is well-controlled. And as shown in FIG. 6, only the cap region 53 with a relatively low concentration of germanium is then able to grow on the top of the center region 52 horizontally contacted with the remained amorphous layer 3. The cap region 53 has a metal concentration in a range of 20%-30% to be used to protect the center region 52. In an embodiment, the alloy 5 is silicon-germanium (SiGe) doped with boron, and the cap region 53 has a metal concentration of about 25% to be used as a SiGe cap to protect the higher-concentration center region 52.

Figure 7:
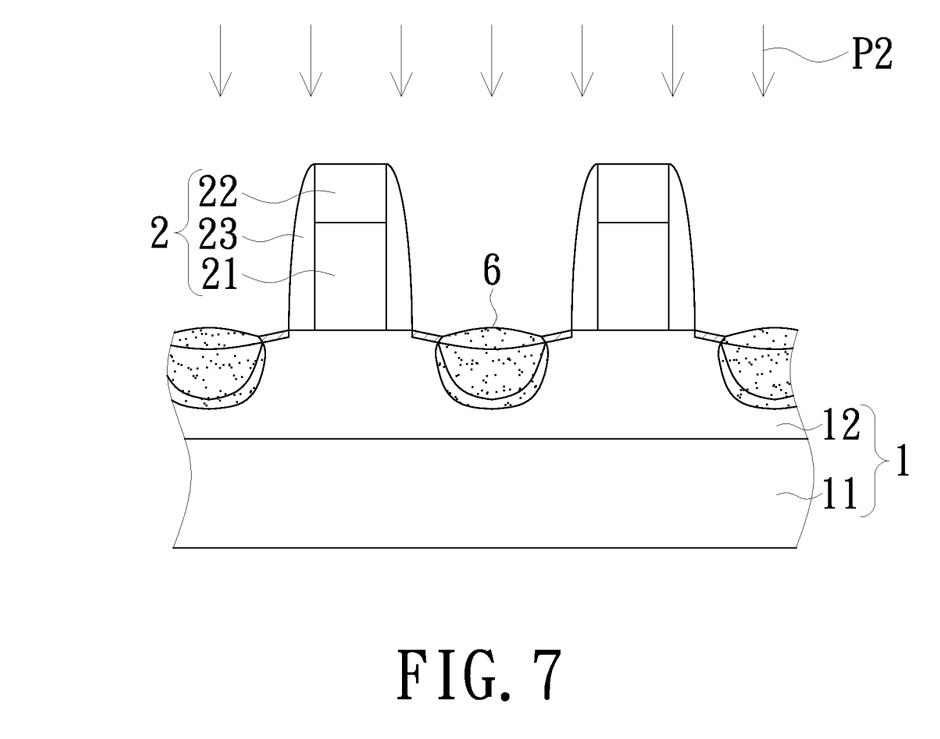
FIG. 7 is a cross-sectional view illustrating removal of the sacrificial spacers and source/drain implantation according to the method provided by the present invention.

Sequentially as shown in FIG. 7, the sacrificial spacers 4 are removed, and then a source/drain implantation P2 is performed to form a source/drain epitaxial structure 6.

In the case of polysilicon gate, the conductor layer 21 is polysilicon, and the gate structure 2 can be formed by gate-first process as the illustration above. On the other hand, in the case of metal gate, the conductor layer 21 is made of copper, or any other suitable metal, the gate structure 2 can be formed by gate-last process using silicon as a dummy gate as the process illustrated above. And then a dummy gate removal process is performed after the source/drain implantation to refill in a metal electrode in-between the spacers 23 (not shown). In one embodiment, the metal electrode is copper; however, other suitable metal can be used in different cases.

In the conventional manufacturing method, the height of source/drain epitaxial structure is varied (being of different heights), and most commonly, the center region of a wafer is higher than the edge region of a wafer. The present invention provides a method of manufacturing a FinFET and a device thereof with an amorphous layer by an amorphous implantation in order to improve (by reducing) height variation of epitaxial grown sources and drains. Due to the amorphous layer 3 on the top edge of the trench T1, the high concentrated center region 52 of the alloy 5 (active region of the source/drain) is not able to grow above the amorphous layer even with longer time of epitaxial growth. And thus, the height of the source/drain epitaxial structure at the edge of a wafer can have about same height as the source/drain epitaxial structure at the center of the wafer. Better product yield and better performance of a FinFET device is then achieved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of a fin-shaped field effect transistor (FinFET), comprising:
   providing a substrate having a fin structure;
   forming a gate structure on the fin structure perpendicular to a extending direction of the fin structure;
   performing a lightly-doped source and drain (LDD) process and an amorphous implantation to form an amorphous layer on an exposed portion of the fin structure exposed by the gate structure and;
   forming a sacrificial spacer on sides of the gate structure covering a portion of the amorphous layer on the fin structure;
   forming a trench on the fin structure adjacent to the sacrificial spacer;
   growing an alloy in the trench; and
   removing the sacrificial spacer.

2. The manufacturing method of a fin-shaped field effect transistor (FinFET) according to claim 1, wherein the gate structure comprises a conductor layer, a dielectric protecting layer on the top of the conductor layer, and a pair of spacers on sides of the stack of the conductor layer and the dielectric protecting layer.

3. The manufacturing method of a fin-shaped field effect transistor (FinFET) according to claim 2, wherein the conductor layer is polysilicon.

4. The manufacturing method of a fin-shaped field effect transistor (FinFET) according to claim 2, wherein the dielectric protecting layer is a multi-layer structure.

5. The manufacturing method of a fin-shaped field effect transistor (FinFET) according to claim 2, the method further comprises:
   removing the conductor layer and the dielectric protecting layer; and
   forming a metal electrode in-between the pair of spacers.

6. The manufacturing method of a fin-shaped field effect transistor (FinFET) according to claim 1, wherein the lightly-doped source and drain (LDD) implantation is performed after the amorphous implantation.

7. The manufacturing method of a fin-shaped field effect transistor (FinFET) according to claim 1, wherein the lightly-doped source and drain (LDD) implantation is performed before the amorphous implantation.

8. The manufacturing method of a fin-shaped field effect transistor (FinFET) according to claim 1, wherein a precursor of the amorphous implantation is selected from the group consisting of indium (In), argon (Ar), antimony (Sb), and germanium (Ge).

9. The manufacturing method of a fin-shaped field effect transistor (FinFET) according to claim 1, wherein the step of forming the trench comprises removing an exposed portion of the amorphous layer exposed by the sacrificial spacers and the gate structure.

10. The manufacturing method of a fin-shaped field effect transistor (FinFET) according to claim 1, wherein the alloy comprises a high concentrated center region and a low concentrated cap region, the center region is of a higher concentration of a metal component the cap region is of a lower concentration of the metal component, the cap region is disposed on the top of the center region.

11. The manufacturing method of a fin-shaped field effect transistor (FinFET) according to claim 10, wherein the center region being of higher concentration of the metal component is partially covered by the amorphous layer.

* * * * *